United States Patent
Chen et al.

(12) 
(10) Patent No.: US 11,152,927 B1
(45) Date of Patent: Oct. 19, 2021

(54) LOW DISTORTION TRIANGULAR WAVE GENERATOR CIRCUIT AND LOW DISTORTION TRIANGULAR WAVE GENERATION METHOD

(71) Applicant: RICHTEK TECHNOLOGY CORPORATION, Zhubei (TW)

(72) Inventors: Yi-Kuang Chen, Taichung (TW); Ming-Jun Hsiao, Hsinchu (TW)

( * ) Notice: Subject to any disclaimer, the term of this patent is extended or adjusted under 35 U.S.C. 154(b) by 0 days.

(21) Appl. No.: 17/188,962

(22) Filed: Mar. 1, 2021

Related U.S. Application Data

(60) Provisional application No. 62/994,373, filed on Mar. 25, 2020.

(30) Foreign Application Priority Data

Sep. 30, 2020 (TW) ................................ 109134070

(51) Int. Cl.
*H03K 4/06* (2006.01)
*G11C 27/02* (2006.01)

(52) U.S. Cl.
CPC ............... *H03K 4/06* (2013.01); *G11C 27/02* (2013.01)

(58) Field of Classification Search
CPC .......... G11C 27/02; H03K 4/06; H03K 4/063; H03K 4/066

USPC ............... 327/131, 132, 133, 134, 135, 137
See application file for complete search history.

(56) References Cited

U.S. PATENT DOCUMENTS

| | | | |
|---|---|---|---|
| 7,746,130 B2 | 6/2010 | Chang | |
| 8,044,690 B2 | 10/2011 | Patel et al. | |
| 9,300,281 B2 | 3/2016 | Tsao | |
| 2004/0036529 A1* | 2/2004 | Tsuji | H03F 3/217 330/10 |
| 2011/0270427 A1 | 11/2011 | Takahashi et al. | |

* cited by examiner

*Primary Examiner* — William Hernandez
(74) *Attorney, Agent, or Firm* — Tung & Associates

(57) ABSTRACT

A low distortion triangular wave generator circuit generates a triangular wave signal by performing integration on an integration capacitor via a charging current and a discharging current during a charging period and a discharging period within a switching period of an external clock signal. A time length of the charging period is identical to a time length of the discharging period. A common mode related signal related to a common mode characteristic of the triangular wave signal is generated. An adjusting signal is generated according to a difference between the common mode related signal and a predetermined DC (direct current) level. The adjusting signal adjusts at least one of the charging current and the discharging current via feedback mechanism such that the triangular wave signal is a symmetrical triangular wave, and an average voltage of the triangular wave signal is equal to a target DC level.

26 Claims, 16 Drawing Sheets

US 11,152,927 B1

LOW DISTORTION TRIANGULAR WAVE GENERATOR CIRCUIT AND LOW DISTORTION TRIANGULAR WAVE GENERATION METHOD

CROSS REFERENCE

The present invention claims priority to U.S. 62/994,373 filed on Mar. 25, 2020 and claims priority to TW 109134070 filed on Sep. 30, 2020.

BACKGROUND OF THE INVENTION

Field of Invention

The present invention relates to a triangular wave generator circuit; particularly, it relates to a low distortion triangular wave generator circuit. The present invention also relates to a low distortion triangular wave generation method.

Description of Related Art

The following prior arts are relevant to the present invention: U.S. Pat. No. 9,300,281B2, U.S. Pat. No. 7,746,130B2, U.S. Pat. No. 8,044,690B2, "A Sub 1-V Constant Gm-C Switched-Capacitor Current Source", IEEE TRANSACTIONS ON CIRCUITS AND SYSTEMS-II: EXPRESS BRIEFS, VOL. 54, NO. 3, MARCH 2007, and "A Low Area, Switched-Resistor Loop Filter Technique for Fractional-N Synthesizers Applied to a MEMS-based Programmable Oscillator", ISSCC, Session 13.1, 2010.

Please refer to FIG. 1A and FIG. 1B. FIG. 1A shows a schematic block diagram of a conventional triangular wave generator circuit 101. FIG. 1B illustrates a waveform diagram depicting the operation of the conventional triangular wave generator circuit 101 of FIG. 1A. One of the two comparators of the conventional triangular wave generator circuit 101 compares a triangular wave signal VTR with a target peak level VH, and the other one of the two comparators of the conventional triangular wave generator circuit 101 compares the triangular wave signal VTR with a target valley level VL; the conventional triangular wave generator circuit 101 controls a charging current and a discharging current according to the comparison results of the two comparators, such that in a steady state, the peak and the valley of the triangular wave signal VTR will be equal to the target peak level VH and the target valley level VL, respectively.

The conventional triangular wave generator circuit 101 shown in FIG. 1A has the following drawbacks that: the time period in which the conventional triangular wave generator circuit 101 can adjust the charging current and the discharging current is limited to a part of the charging period or a part of the discharging period. Consequently and undesirably, the rising slope or the falling slope of the triangular wave signal VTR generated by the conventional triangular wave generator circuit 101 may not be constant, that is, the triangular wave signal VTR is distorted.

Please refer to FIG. 2A and FIG. 2B. FIG. 2A shows a schematic block diagram of another conventional triangular wave generator circuit 102. FIG. 2B illustrates a waveform diagram depicting the operation of the conventional triangular wave generator circuit 102 of FIG. 2A. Similar to the conventional triangular wave generator circuit 101 of FIG. 1A, one of the two comparators of the conventional triangular wave generator circuit 102 compares a triangular wave signal VTR with a target peak level VH, and the other one of the two comparators of the conventional triangular wave generator circuit 102 compares the triangular wave signal VTR with a target valley level VL; the conventional triangular wave generator circuit 102 controls a charging current and a discharging current according to the comparison results of the two comparators, such that in a steady state, the peak and the valley of the triangular wave signal VTR will be equal to the target peak level VH and the target valley level VL, respectively.

The conventional triangular wave generator circuit 102 shown in FIG. 2A has the following drawback that: in a case where the charging current is not equal to the discharging current, the rising period and the falling period of the generated triangular wave signal VTR will not be equal to each other; that is, the generated triangular wave signal VTR will be an asymmetrical triangular wave, causing a relatively higher distortion.

As compared to the prior arts in FIG. 1A and FIG. 2A, the present invention is advantageous in that: the present invention can generate a triangular wave signal VTR having one single slope and the triangular wave signal VTR generated by the present invention is a symmetrical triangular wave. Consequently and desirably, the triangular wave signal VTR generated by the present invention is more accurate than the prior arts.

SUMMARY OF THE INVENTION

From one perspective, the present invention provides a low distortion triangular wave generator circuit, comprising: an integration circuit, which is configured to operably receive an external clock signal, wherein during a charging period and a discharging period within a switching period of the external clock signal, the integration circuit respectively performs integration on an integration capacitor by a charging current and a discharging current, so as to generate a triangular wave signal; wherein a time length of the charging period is identical to a time length of the discharging period; and an adjustment control circuit, which is configured to operably generate a common mode related signal according to the triangular wave signal, wherein the common mode related signal is related to a common mode characteristic of the triangular wave signal, and wherein the adjustment control circuit is configured to operably generate an adjusting signal with a gain according to a difference between the common mode related signal and a predetermined direct current (DC) level; wherein the adjusting signal is configured to operably adjust at least one of the charging current and the discharging current by feedback mechanism, such that the triangular wave signal is a symmetrical triangular wave and an average voltage of the triangular wave signal is equal to a target DC level.

In one embodiment, the adjustment control circuit only adjusts one of the charging current and the discharging current.

In one embodiment, the adjustment control circuit includes: a sample-and-hold circuit, which is configured to operably and periodically sample and hold the triangular wave signal at a sample-and-hold timing point within the switching period, so as to generate the common mode related signal; and an error amplification circuit, which is configured to operably amplify the difference between the common mode related signal and the predetermined DC level, so as to generate the adjusting signal, wherein a relationship between the predetermined DC level and the target DC level is determined according to a ratio relationship between the sample-and-hold timing point and the switching period.

In one embodiment, the sample-and-hold circuit is configured to operably sample and hold the triangular wave signal according to a phase difference clock signal, wherein a phase of the phase difference clock signal is different from a phase of the switching period by 90 degrees, such that a middle value of a rising ramp or a middle value of a falling ramp of the triangular wave signal is sampled and held, thus generating the common mode related signal; wherein the error amplification circuit adopts the target DC level as the predetermined DC level.

In one embodiment, the low distortion triangular wave generator circuit is characterized in one of the following: (1) wherein the sample-and-hold circuit is configured to operably sample and hold a peak of the triangular wave signal according to the external clock signal, so as to generate the common mode related signal; wherein the error amplification circuit adopts a target peak level of the triangular wave signal as the predetermined DC level; or (2) wherein the sample-and-hold circuit is configured to operably sample and hold a valley of the triangular wave signal according to the external clock signal, so as to generate the common mode related signal; wherein the error amplification circuit adopts a target valley level of the triangular wave signal as the predetermined DC level.

In one embodiment, the sample-and-hold circuit is configured to operably sample and hold the triangular wave signal in an interleaving manner, and the sampled and held results is combined to become the common mode related signal.

In one embodiment, the adjustment control circuit includes a filter amplification circuit, which includes: an error amplifier; and a low-pass filter feedback network, which is coupled to the error amplifier to form a feedback loop, wherein the error amplification circuit and the low-pass filter feedback network are configured to operably receive the triangular wave signal to obtain the common mode related signal and also to amplify a difference between the triangular wave signal and the predetermined DC level to generate the adjusting signal; wherein the error amplifier adopts the target DC level as the predetermined DC level.

In one embodiment, the adjustment control circuit includes: a comparison circuit, which is configured to operably compare the triangular wave signal with a reference signal, so as to generate a pulse width modulation (PWM) signal; and a filter amplification circuit, including: an error amplification circuit; and a low-pass filter feedback network, which is coupled to the error amplification circuit to form a feedback loop, wherein the error amplification circuit and the low-pass filter feedback network are configured to operably receive the PWM signal to obtain the common mode related signal and also to amplify a difference between the PWM signal and the predetermined DC level to generate the adjusting signal; wherein the predetermined DC level is correlated with the reference signal, a target peak level of the triangular wave signal, a target valley level of the triangular wave signal and an amplitude of the PWM signal; and wherein the reference signal lies between the target peak level and the target valley level.

In one embodiment, the reference signal corresponds to the target DC level, whereas, the predetermined DC level corresponds to ½ of the amplitude of the PWM signal.

In one embodiment, the adjustment control circuit includes: a comparison circuit, which is configured to operably compare the triangular wave signal with the target DC level, so as to generate a pulse width modulation (PWM) signal; a duty ratio comparison circuit, which is configured to operably compare the PWM signal with the external clock signal or which is configured to operably compare the PWM signal with a phase difference clock signal, so as to generate a duty ratio error signal, wherein a phase of the phase difference clock signal is different from a phase of the switching period by 90 degrees; and a filter circuit, which is configured to operably filter the duty ratio error signal, so as to obtain the common mode related signal and also generate the adjusting signal.

In one embodiment, the filter circuit includes: an error amplification circuit; and a low-pass filter feedback network, which is coupled to the error amplification circuit to form a feedback loop, wherein the error amplification circuit and the low-pass filter feedback network are configured to operably receive the duty ratio error signal to obtain the common mode related signal, and also to amplify a difference between the duty ratio error signal and the predetermined DC level to generate the adjusting signal; wherein the predetermined DC level corresponds to ½ of an amplitude of the duty ratio error signal.

In one embodiment, the duty ratio comparison circuit includes: a logic comparison circuit, which is configured to operably compare the PWM signal with the external clock signal or which is configured to operably compare the PWM signal with the phase difference clock signal, so as to generate a pull-up signal and a pull-down signal, which are indicative of a duty ratio difference of a rising edge and a duty ratio difference of a falling edge, respectively; and a switching circuit, which is configured as one of the following: (1) the switching circuit includes: an upper side switch and a lower side switch, which are connected in series between a supply voltage and a ground level, wherein the upper side switch and the lower side switch are switched according to the pull-up signal and the pull-down signal, respectively, so as to generate the duty ratio error signal, wherein a voltage difference between the supply voltage and the ground level corresponds to an amplitude of the duty ratio error signal, wherein the filter circuit is configured to operably filter the duty ratio error signal, so as to obtain the common mode related signal and also generate the adjusting signal; or (2) the switching circuit includes: an upper side current source and a lower side current source, which are connected in series between the supply voltage and the ground level, wherein the upper side current source and the lower side current source are switched according to the pull-up signal and the pull-down signal, respectively, so as to generate the duty ratio error signal, wherein a voltage difference between the supply voltage and the ground level corresponds to an amplitude of the duty ratio error signal, wherein the filter circuit is configured to operably perform integration on and filter the duty ratio error signal, so as to obtain the common mode related signal and also generate the adjusting signal.

In one embodiment, the integration circuit includes: the integration capacitor; a variable current circuit, which is configured to operably generate one of the charging current and the discharging current according to the adjusting signal; a first constant current source, which is configured to operably generate the other of the charging current and the discharging current; and a selection circuit, which is configured to operably select the charging current or the discharging current to perform integration on the integration capacitor according to the external clock signal, so as to generate the triangular wave signal.

In one embodiment, the variable current circuit is configured as one of the followings: (1) the variable current circuit includes: a voltage-controlled current source, which is configured to operably generate one of the charging current and the discharging current according to the adjusting signal and a transconductance coefficient; (2) the variable current circuit includes: a voltage-controlled current source, which is configured to operably generate a variable current according to the adjusting signal and the transconductance coefficient; and a second constant current source, wherein a sum or a difference between the variable current and a current of the second constant current source corresponds to one of the charging current and the discharging current; (3) the variable current circuit includes: a third constant current source; a differential transistor pair, which commonly receive and distribute a current of the second constant current source, wherein one of the differential transistor pair is offset to a reference voltage, whereas, the other of the differential transistor pair is controlled by the adjusting signal, wherein a current flowing through the differential transistor pair corresponds to one of the charging current and the discharging current; or (4) the variable current circuit includes: an analog-to-digital converter (ADC), which is configured to operably convert the adjusting signal to a digital switching signal; at least one conversion switch, which is coupled to the corresponding at least one sub-current source, wherein the at least one conversion switch is configured to operably receive the digital switching signal, so as to correspondingly switch the at least one sub-current source, and combine the current of the at least one sub-current source to generate one of the charging current and the discharging current in accordance to the adjusting signal.

In one embodiment, in a case where the variable current circuit is configured as (1), (2) or (3), the selection circuit includes: a major switch, which is configured to operably control one of the charging current and the discharging current to perform integration on the integration capacitor; and a bypass switch, which is configured to operably cause one of the charging current and the discharging current to be conducted to a reference level in a case where one of the charging current and the discharging current does not perform integration on the integration capacitor.

From another perspective, the present invention provides a low distortion triangular wave generation method, comprising: during a charging period and a discharging period within a switching period of an external clock signal, respectively performing integration on an integration capacitor by a charging current and a discharging current, so as to generate a triangular wave signal; wherein a time length of the charging period is identical to a time length of the discharging period; and generating a common mode related signal according to the triangular wave signal, wherein the common mode related signal is related to a common mode characteristic of the triangular wave signal, and generating an adjusting signal with a gain according to a difference between the common mode related signal and a predetermined direct current (DC) level; and adjusting at least one of the charging current and the discharging current according to the adjusting signal by feedback mechanism, such that the triangular wave signal is a symmetrical triangular wave and an average voltage of the triangular wave signal is equal to a target DC level.

In one embodiment, only one of the charging current and the discharging current is adjusted.

In one embodiment, the step of generating the adjusting signal includes: periodically sampling and holding the triangular wave signal at a sample-and-hold timing point within the switching period, so as to generate the common mode related signal; and amplifying the difference between the common mode related signal and the predetermined DC level, so as to generate the adjusting signal, wherein a relationship between the predetermined DC level and the target DC level is determined according to a ratio relationship between the sample-and-hold timing point and the switching period.

In one embodiment, the step of generating the common mode related signal includes: sampling and holding the triangular wave signal according to a phase difference clock signal, wherein a phase of the phase difference clock signal is different from a phase of the switching period by 90 degrees, such that a middle value of a rising ramp or a middle value of a falling ramp of the triangular wave signal is sampled and held, thus generating the common mode related signal; wherein the target DC level is adopted as the predetermined DC level.

In one embodiment, the step of periodically sampling and holding the triangular wave signal to generate the common mode related signal includes one of the following: (1) sampling and holding a peak of the triangular wave signal according to the external clock signal, so as to generate the common mode related signal; wherein a target peak level of the triangular wave signal is adopted as the predetermined DC level; or (2) sampling and holding a valley of the triangular wave signal according to the external clock signal, so as to generate the common mode related signal; wherein a target valley level of the triangular wave signal is adopted as the predetermined DC level.

In one embodiment, the step of generating the common mode related signal further including: sampling and holding the triangular wave signal in an interleaving manner, and combining the sampled and held results to become the common mode related signal.

In one embodiment, the step of generating the adjusting signal includes: obtaining the common mode related signal and also amplifying a difference between the triangular wave signal and the predetermined DC level by active low-pass filtering, so as to generate the adjusting signal; wherein the target DC level is adopted as the predetermined DC level.

In one embodiment, the step of generating the adjusting signal includes: comparing the triangular wave signal with a reference signal, so as to generate a pulse width modulation (PWM) signal; and obtaining the common mode related signal and amplifying a difference between the duty ratio error signal and the predetermined DC level to generate the adjusting signal by active low-pass filtering; wherein the predetermined DC level is correlated with the reference signal, a target peak level of the triangular wave signal, a target valley level of the triangular wave signal and an amplitude of the PWM signal; and wherein the reference signal lies between the target peak level and the target valley level.

In one embodiment, the reference signal corresponds to the target DC level, whereas, the predetermined DC level corresponds to ½ of the amplitude of the PWM signal.

In one embodiment, the step of generating the adjusting signal includes: comparing the triangular wave signal with the target DC level, so as to generate a pulse width modulation (PWM) signal; comparing the PWM signal with the external clock signal or comparing the PWM signal with a phase difference clock signal, so as to generate a duty ratio error signal, wherein a phase of the phase difference clock signal is different from a phase of the switching period by 90 degrees; and filtering the duty ratio error signal, so as to obtain the common mode related signal and also generate the adjusting signal.

In one embodiment, the step of filtering the duty ratio error signal includes: obtaining the common mode related signal and also amplifying a difference between the duty ratio error signal and the predetermined DC level to generate the adjusting signal by active low-pass filtering; wherein the predetermined DC level corresponds to ½ of an amplitude of the duty ratio error signal.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
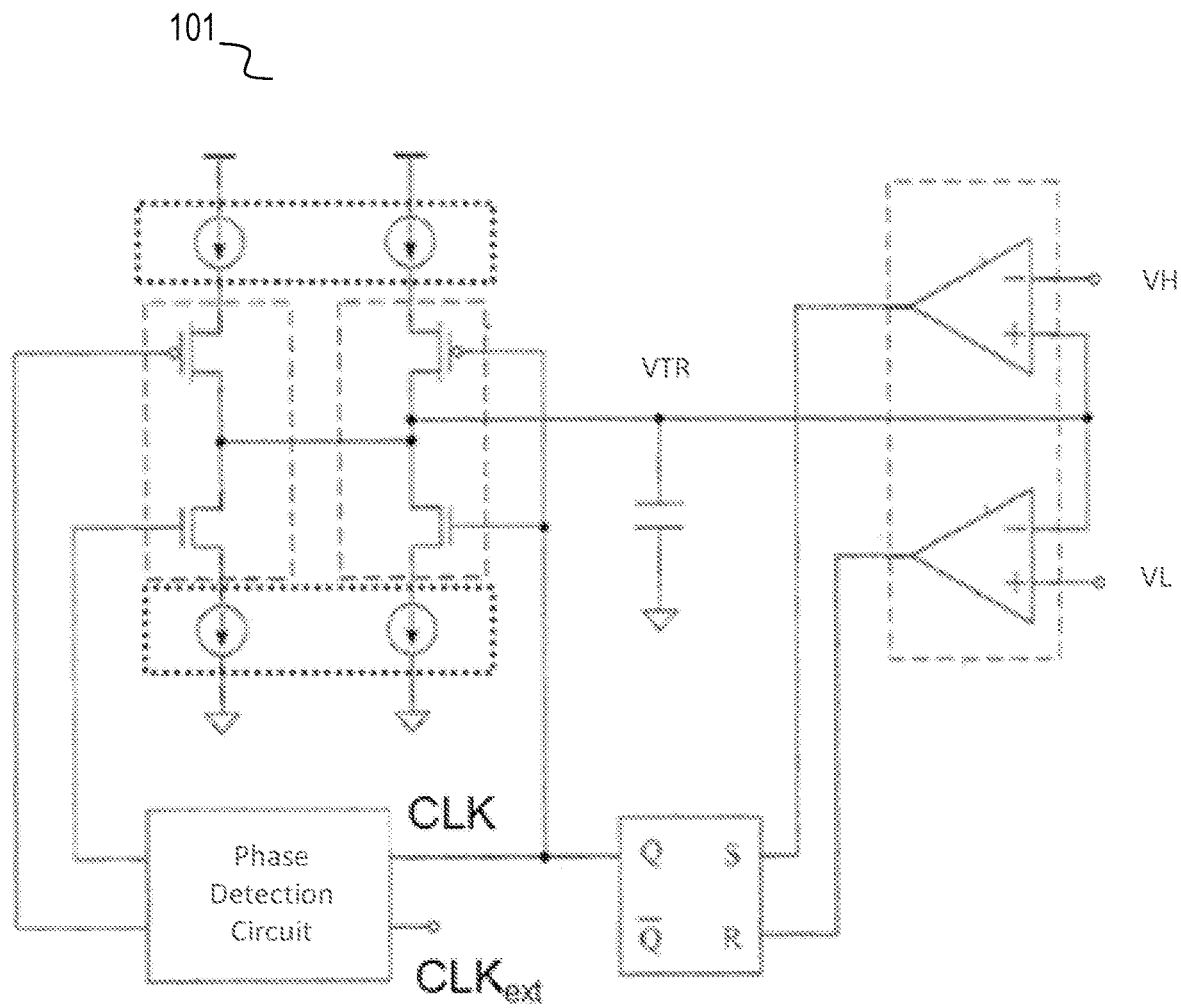
FIG. 1A shows a schematic block diagram of a conventional triangular wave generator circuit.
Figure 1B:
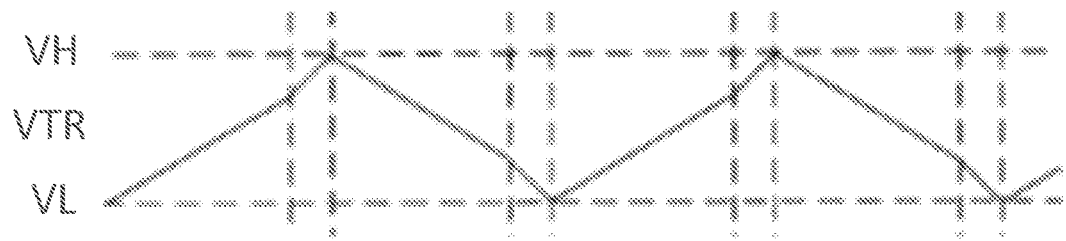
FIG. 1B illustrates a waveform diagram depicting the operation of the conventional triangular wave generator circuit of FIG. 1A.
Figure 2A:
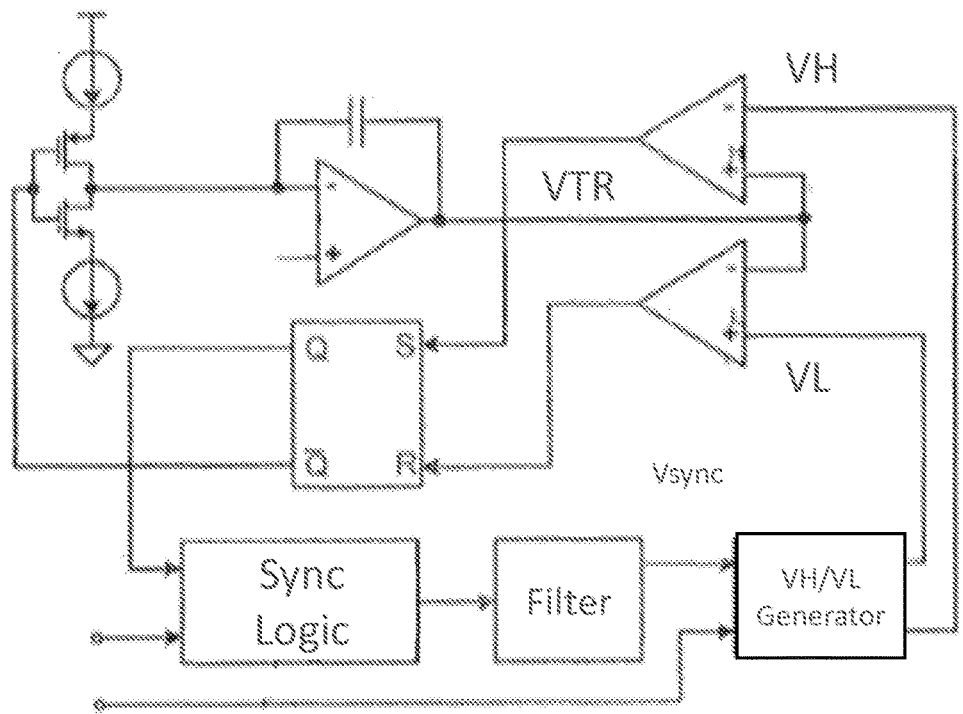
FIG. 2A shows a schematic block diagram of another conventional triangular wave generator circuit.
Figure 2B:
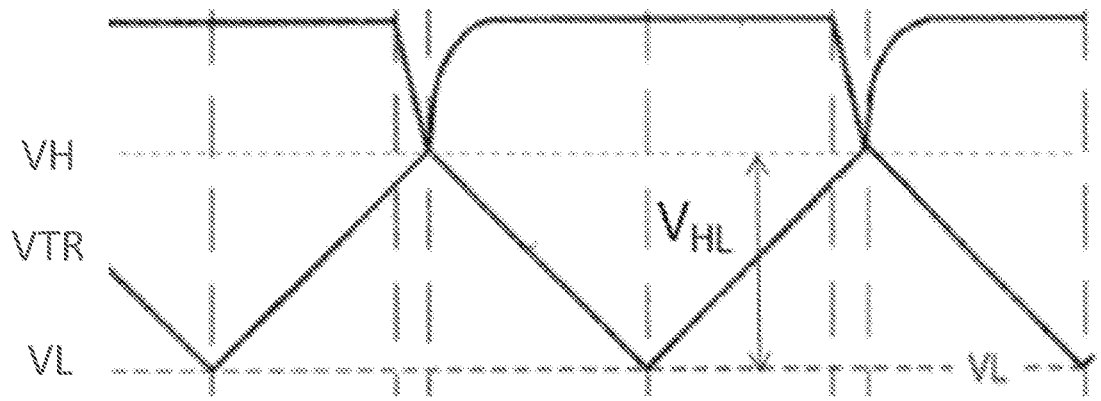
FIG. 2B illustrates a waveform diagram depicting the operation of the conventional triangular wave generator circuit of FIG. 2A.
Figure 3:
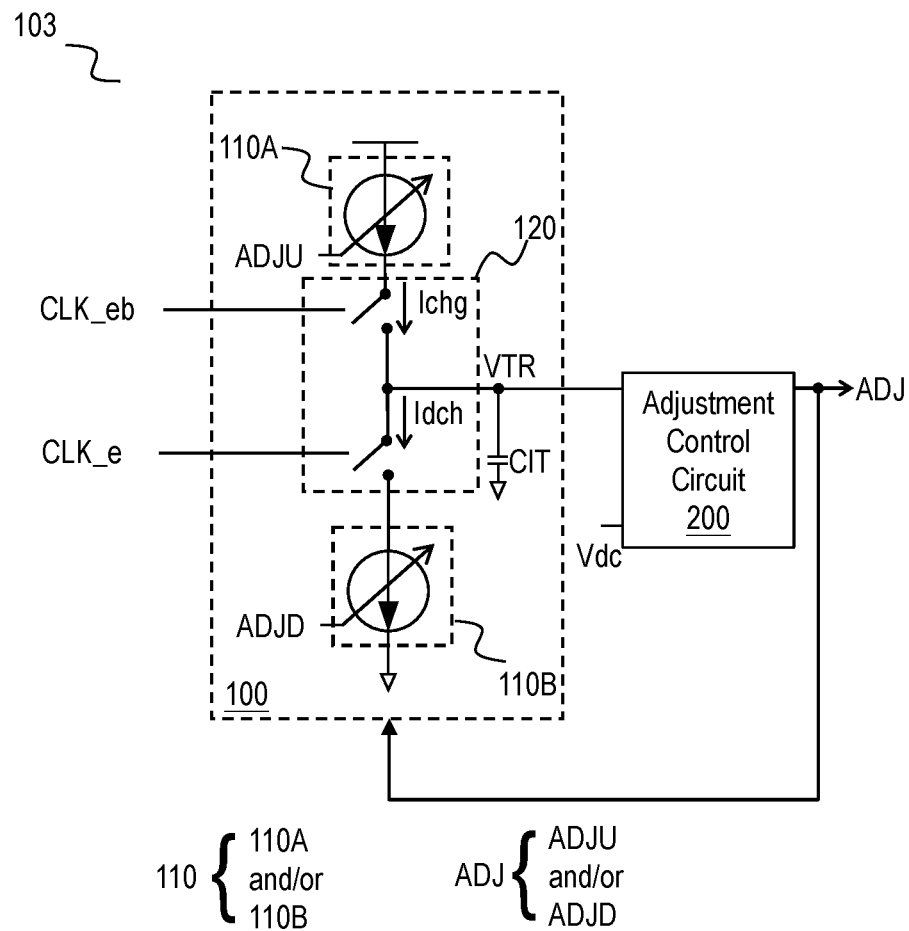
FIG. 3 shows a schematic block diagram of a low distortion triangular wave generator circuit according to an embodiment of the present invention.

Please refer to FIG. 3, which shows a schematic block diagram of a low distortion triangular wave generator circuit (i.e., triangular wave generator circuit 103) according to an embodiment of the present invention. In this embodiment, as shown in FIG. 3, the triangular wave generator circuit 103 comprises: an integration circuit 100 and an adjustment control circuit 200.

The integration circuit 100 receives an external clock signal CLK_e. During a charging period Tchg and a discharging period Tdch within a switching period Tsw of the external clock signal CLK_e, the integration circuit 100 performs integration on an integration capacitor CIT of the integration circuit 100 via a charging current Ichg and a discharging current Idch respectively, so as to generate a triangular wave signal VTR. The time length of the charging period Tchg is identical to the time length of the discharging period Tdch. In one embodiment, each of the charging period Tchg and the discharging period Tdch occupies 50% of the time length of the switching period Tsw.

The adjustment control circuit 200 is configured to operably generate a common mode related signal according to the triangular wave signal VTR, wherein the common mode related signal is related to a common mode characteristic of the triangular wave signal VTR. And, the adjustment control circuit 200 is configured to operably generate an adjusting signal ADJ with a gain according to a difference between the common mode related signal and a predetermined direct current (DC) level Vdc.

It is noteworthy that, in one embodiment, the term "common mode characteristic" refers to a characteristic which is related to a common mode value of the triangular wave signal VTR. From one perspective, the common mode value of the triangular wave signal VTR is the low frequency portion or the direct current portion of the triangular wave signal VTR. In one embodiment, the "common mode characteristic" corresponds to the common mode value of the triangular wave signal VTR, or, the common mode value of the triangular wave signal VTR plus an offset value. In still another embodiment, the "common mode characteristic" corresponds to a peak or a valley of the triangular wave signal VTR.

Please still refer to FIG. 3. The adjusting signal ADJ is configured to operably adjust at least one of the charging current Ichg and the discharging current Idch via feedback mechanism, such that the triangular wave signal VTR is a symmetrical triangular wave, and an average voltage of the triangular wave signal VTR is equal to a target DC level VCM. In other words, under such situation, the current absolute value of the charging current Ichg and the current absolute value of the discharging current Idch will be adjusted to become identical to each other via the adjusting signal ADJ.

To explain this from another perspective, in a case where the current absolute value of the charging current Ichg and the current absolute value of the discharging current Idch are not identical to each other, since each of the charging period Tchg and the discharging period Tdch occupies 50% of the time length of the switching period Tsw, the common mode value of the integrated triangular wave signal VTR will be continually increased or be continually decreased. Therefore, when the average voltage of the triangular wave signal VTR is equal to a target DC level VCM, it indicates that the current absolute value of the charging current Ichg is identical to the current absolute value of the discharging current Idch. Under such situation, the triangular wave signal VTR is a symmetrical triangular wave.

Please still refer to FIG. 3. In one embodiment, the integration circuit 100 includes: an integration capacitor CIT, current circuits 110A and 110B and a selection circuit 120. In one embodiment, the current circuits 110A and 110B are configured to operably supply the above-mentioned charging current Ichg and discharging current Idch, respectively. In one embodiment, the selection circuit 120 is configured to operably select the charging current Ichg or the discharging current Idch to perform integration on the integration capacitor CIT according to the external clock signal CLK_e (and a complementary signal of the external clock signal CLK_e, namely, the external clock signal CLK_eb). In more detail, the external clock signal CLK_eb is configured to operably control a conduction period of the charging current Ichg, whereas, the external clock signal CLK_e is configured to operably control a conduction period of the discharging current Idch.

Furthermore, according to the present invention, at least one of the current circuit 110A and the current circuit 110B is a variable current circuit. In one embodiment, both the current circuit 110A and the current circuit 110B are variable current circuits; the integration circuit 100 can control both current levels of the charging current Ichg and the discharging current Idch according to the adjusting signal ADJ. More specifically, an adjusting signal ADJU is for controlling the current level of the charging current Ichg, whereas an adjusting signal ADJD is for controlling the current level of the discharging current Idch.

In another embodiment, according to the present invention, the adjustment control circuit 200 only adjusts one of the charging current Ichg and discharging current Idch but does not adjust the other of the charging current Ichg and discharging current Idch. In other words, in this embodiment, the adjustment control circuit 200 only adjusts one of the charging current Ichg and discharging current Idch via the adjusting signal ADJ. Under such situation, the other one of the charging current Ichg and discharging current Idch will have a constant current level. Under such implementation, it is easier for the integration circuit 100 to adjust the current absolute values of the charging current Ichg and the discharging current Idch to be identical to each other.

In other embodiments, it is also practicable and within the scope and the spirit of the present invention that the charging current Ichg and the discharging current Idch can be both adjusted via the adjusting signal ADJ.

Figure 4:
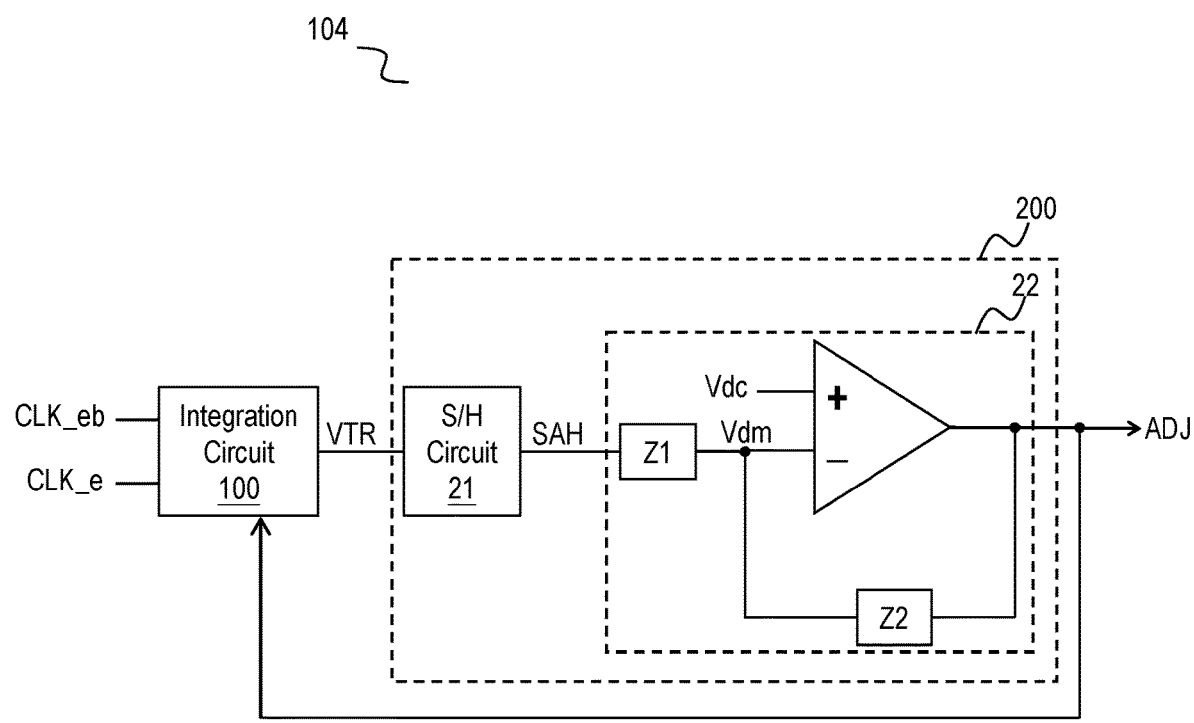
FIG. 4 shows an embodiment of an adjustment control circuit.

Please refer to FIG. 4, which shows an embodiment of an adjustment control circuit in the triangular wave generator circuit 104. In this embodiment, the adjustment control circuit 200 includes: a sample-and-hold circuit 21 and an error amplification circuit 22. The sample-and-hold circuit is configured to operably and periodically sample and hold the triangular wave signal VTR at a sample-and-hold timing point within the switching period Tsw, so as to generate the common mode related signal SAH. The error amplification circuit 22 is configured to operably amplify a difference between the common mode related signal SAH and the predetermined DC level Vdc, so as to generate the adjusting signal ADJ, wherein the relationship between the predetermined DC level Vdc and the target DC level VCM is determined according to the ratio relationship between the sample-and-hold timing point and the switching period Tsw. Feedback devices Z1 and Z2 in the error amplification circuit 22 can be implemented as resistive devices or capacitive devices. The specific details for the implementation of the above-mentioned sample-and-hold circuit 21 will be described later.

Figure 5A:
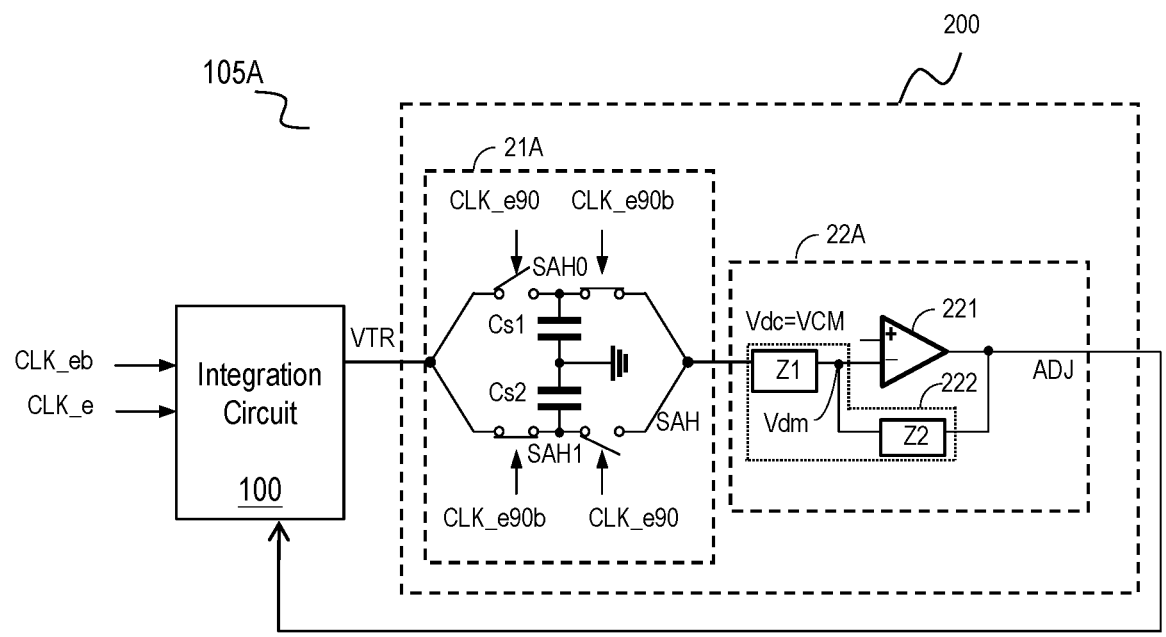
FIG. 5A shows a specific embodiment of a sample-and-hold circuit and a specific embodiment of an error amplification circuit.
Figure 5B:
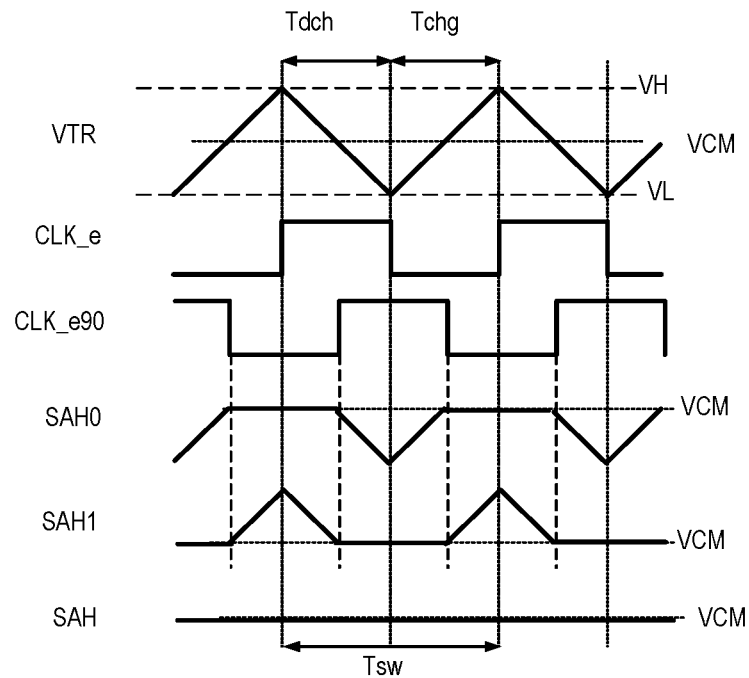
FIG. 5B illustrates a waveform diagram depicting the operation of the circuits in FIG. 5A.

Please refer to FIG. 5A and FIG. 5B. FIG. 5A shows a specific embodiment of a sample-and-hold circuit and a specific embodiment of an error amplification circuit in the triangular wave generator circuit 105A. FIG. 5B illustrates a waveform diagram depicting the operation of the circuits in FIG. 5A. In this embodiment, the sample-and-hold circuit 21A is configured to operably sample and hold the triangular wave signal VTR by a phase difference clock signal CLK_e90. The phase of the phase difference clock signal CLK_e90 is different from a phase of the switching period Tsw by 90 degrees, so as to sample and hold a meddle value of the rising ramp or a meddle value of the falling ramp of the triangular wave signal VTR, thus generating the above-mentioned common mode related signal SAH. In this embodiment, as shown in FIG. 5A and FIG. 5B, because it is the middle value of the rising ramp or the middle value of the falling ramp of the triangular wave signal VTR that is sampled and held, the predetermined DC level Vdc of the error amplification circuit 22A is set as the target DC level VCM. In other words, through adjusting at least one of the charging current Ichg and the discharging current Idch, when the middle value of the rising ramp or the middle value of the falling ramp of the triangular wave signal VTR is adjusted to the target DC level VCM, the triangular wave signal VTR will be a symmetrical triangular wave and an average voltage of the triangular wave signal VTR will be equal to the target DC level VCM. In one embodiment, the error amplification circuit 22A includes: an error amplifier 221 and a low-pass filter feedback network 222.

More specifically, in this embodiment, the sample-and-hold circuit 21A includes: a holding capacitor Cs1 and corresponding sampling switches. The holding capacitor Cs1 and its corresponding sampling switches are configured to operably sample and hold the triangular wave signal VTR according to the phase difference clock signal CLK_e90 and the phase difference clock signal CLK_e90b, so as to generate a sample-and-hold signal SAH0 and a sample-and-hold signal SAH1 (they correspond to the common mode related signal SAH). In one embodiment, the sample-and-hold circuit 21A further includes: a holding capacitor Cs2 and its corresponding sampling switches.

In one embodiment, as shown in FIG. 5B, the sample-and-hold circuit 21A is configured to operably sample and hold the triangular wave signal VTR in an interleaving manner, and the results are combined to become the common mode related signal SAH. More specifically, the holding capacitor Cs1 and its corresponding sampling switches generate the sample-and-hold signal SAH0, and the holding capacitor Cs2 and its corresponding sampling switches generate the sample-and-hold signal SAH1; the downstream switches combine the sample-and-hold signal SAH1 and the sample-and-hold signal SAH0 to form the common mode related signal SAH.

Figure 6A:
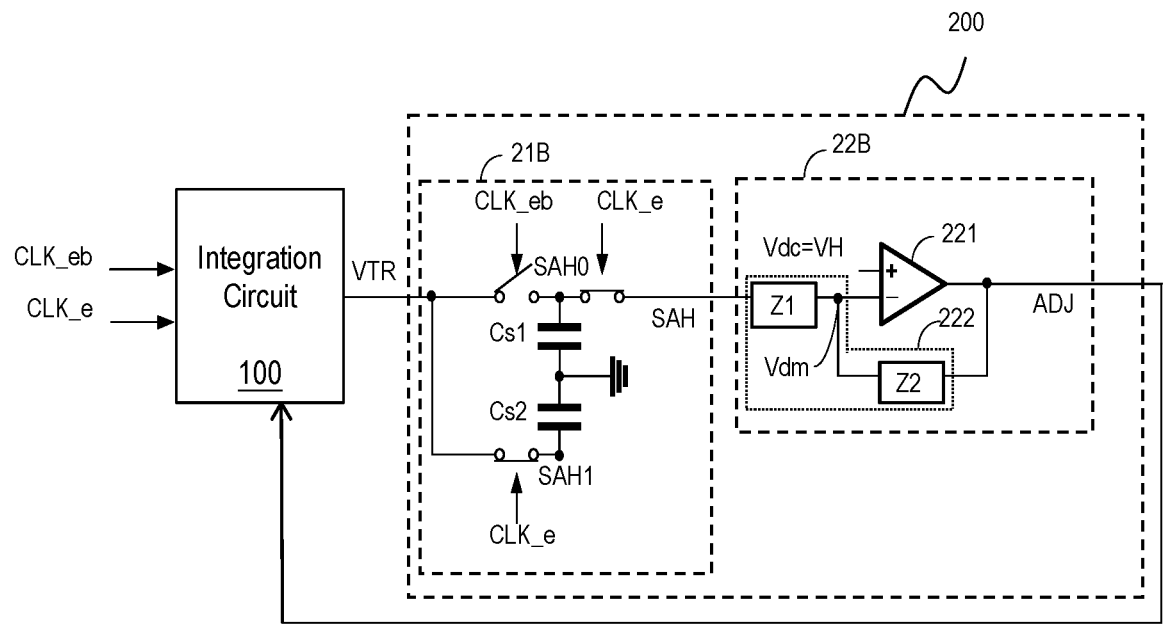
FIG. 6A shows a specific embodiment of a sample-and-hold circuit and a specific embodiment of an error amplification circuit.
Figure 6B:
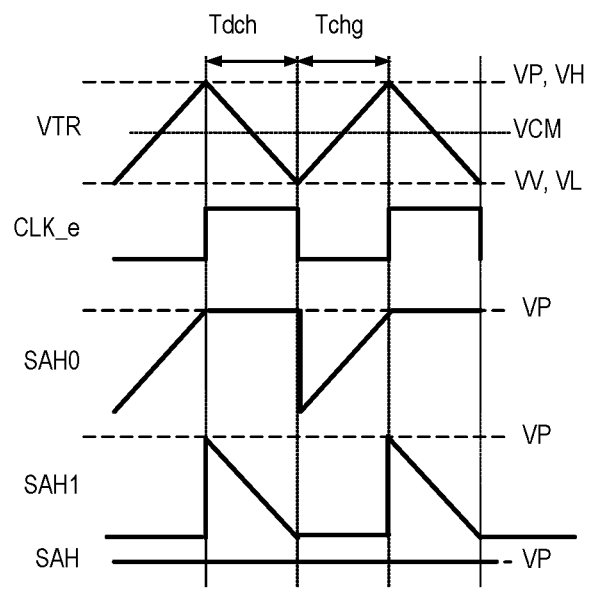
FIG. 6B illustrates a waveform diagram depicting the operation of the circuits in FIG. 6A.

Please refer to FIG. 6A and FIG. 6B. FIG. 6A shows a specific embodiment of a sample-and-hold circuit and a specific embodiment of an error amplification circuit. FIG. 6B illustrates a waveform diagram depicting the operation of the circuits in FIG. 6A. In this embodiment, the sample-and-hold circuit 21B is configured to operably sample and hold a peak VP of a triangular wave signal VTR according to an external clock signal CLK_e, so as to generate the common mode related signal SAH. In other words, in this embodiment, the common mode related signal SAH corresponds to the peak VP of the triangular wave signal VTR. In this embodiment, as shown in FIG. 6A and FIG. 6B, the predetermined DC level Vdc of the error amplification circuit 22A is set as a target peak level VH of the triangular wave signal VTR. As such, through adjusting at least one of the charging current Ichg and the discharging current Idch, when the peak VP of the triangular wave signal VTR is adjusted to the target peak level VH, the triangular wave signal VTR will be a symmetrical triangular wave and an average voltage of the triangular wave signal VTR will be equal to the target DC level VCM. In one embodiment, the sample-and-hold circuit 21B includes: two pairs of holding capacitors and corresponding sampling switches, which are configured to cancel the interference caused by the operation of sampling the triangular wave signal VTR.

Figure 7A:
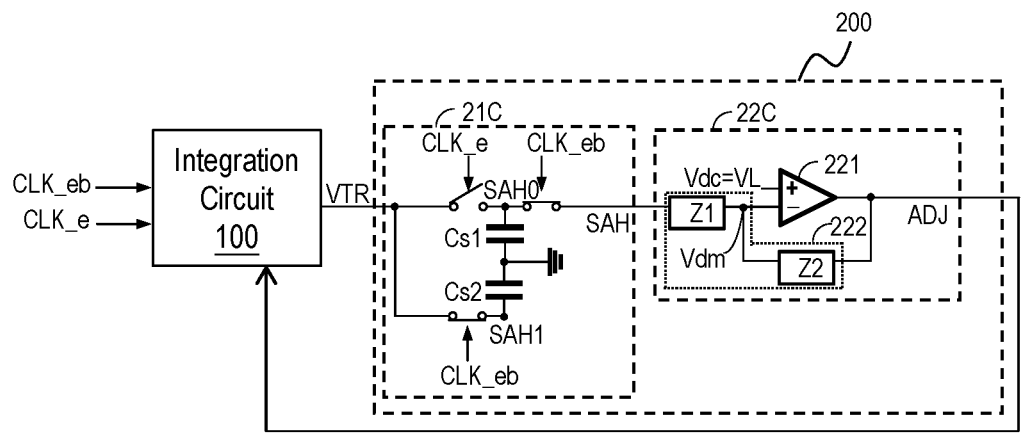
FIG. 7A shows a specific embodiment of a sample-and-hold circuit and a specific embodiment of an error amplification circuit.
Figure 7B:
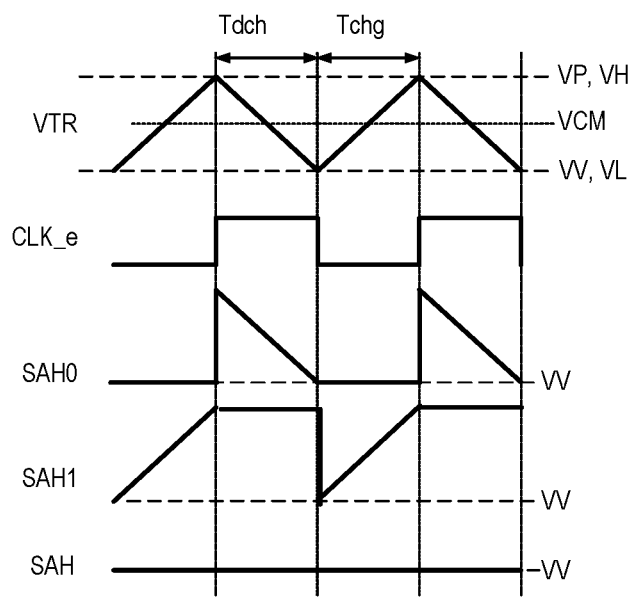
FIG. 7B illustrates a waveform diagram depicting the operation of the circuits in FIG. 7A.

Please refer to FIG. 7A and FIG. 7B. FIG. 7A shows a specific embodiment of a sample-and-hold circuit and a specific embodiment of an error amplification circuit. FIG. 7B illustrates a waveform diagram depicting the operation of the circuits in FIG. 7A. In this embodiment, the sample-and-hold circuit 21C is configured to operably sample and hold a valley VV of a triangular wave signal VTR according to an external clock signal CLK_e, so as to generate the common mode related signal SAH. In other words, in this embodiment, the common mode related signal SAH corresponds to the valley VV of the triangular wave signal VTR. In this embodiment, as shown in FIG. 7A and FIG. 7B, the predetermined DC level Vdc of the error amplification circuit 22C is set as a target valley level VL of the triangular wave signal VTR. As such, through adjusting at least one of the charging current Ichg and the discharging current Idch, when the valley VV of the triangular wave signal VTR is adjusted to the target valley level VL, the triangular wave signal VTR will be a symmetrical triangular wave and an average voltage of the triangular wave signal VTR will be equal to the target DC level VCM.

Figure 8A:
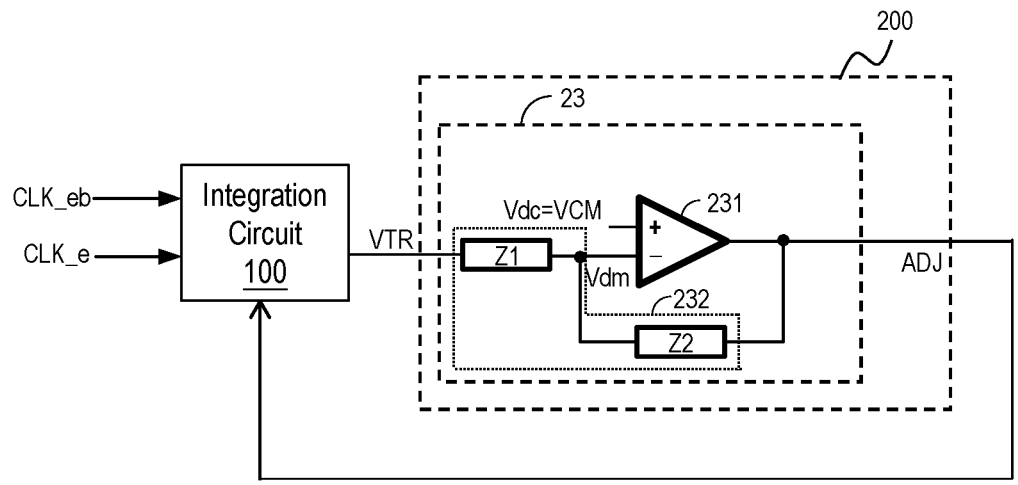
FIG. 8A shows a specific embodiment of a filter amplification circuit.
Figure 8B:
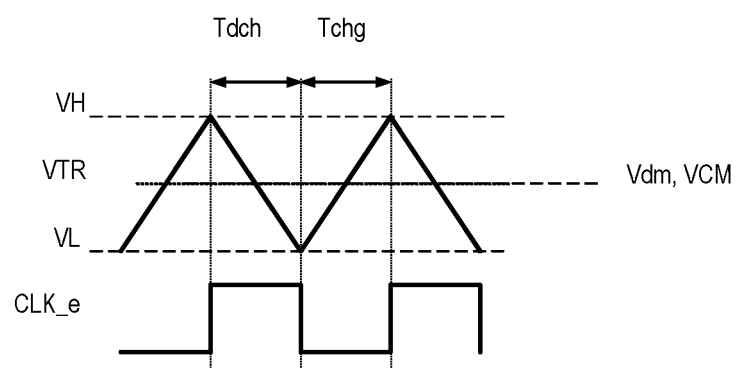
FIG. 8B illustrates a waveform diagram depicting the operation of the circuit in FIG. 8A.

Please refer to FIG. 8A and FIG. 8B. FIG. 8A shows a specific embodiment of a filter amplification circuit. FIG. 8B illustrates a waveform diagram depicting the operation of the circuit in FIG. 8A. In this embodiment, as shown in FIG. 8A, the adjustment control circuit 200 includes a filter amplification circuit 23. In one embodiment, the error amplification circuit 23 includes: an error amplifier 231 and a low-pass filter feedback network 232.

The error amplifier 231 and the low-pass filter feedback network 232 are coupled to each other to form a feedback loop and the error amplifier 231 and the low-pass filter feedback network 232 are configured to operably receive the triangular wave signal VTR. In this embodiment, the error amplifier 231 and the low-pass filter feedback network 232 are configured to operably obtain the common mode related signal, and also to operably amplify a difference between the triangular wave signal VTR and the predetermined DC level Vdc to generate the adjusting signal ADJ, by active low-pass filtering. The error amplifier 231 adopts the target DC level VCM as the predetermined DC level Vdc. In this embodiment, the common mode related signal corresponds to a voltage Vdm at a negative input terminal of the error amplifier 231. As such, through adjusting at least one of the charging current Ichg and the discharging current Idch, when the common mode related signal Vdm of the triangular wave signal VTR is adjusted to the target DC level VCM, the triangular wave signal VTR will be a symmetrical triangular wave and an average voltage of the triangular wave signal VTR will be equal to the target DC level VCM.

Figure 9A:
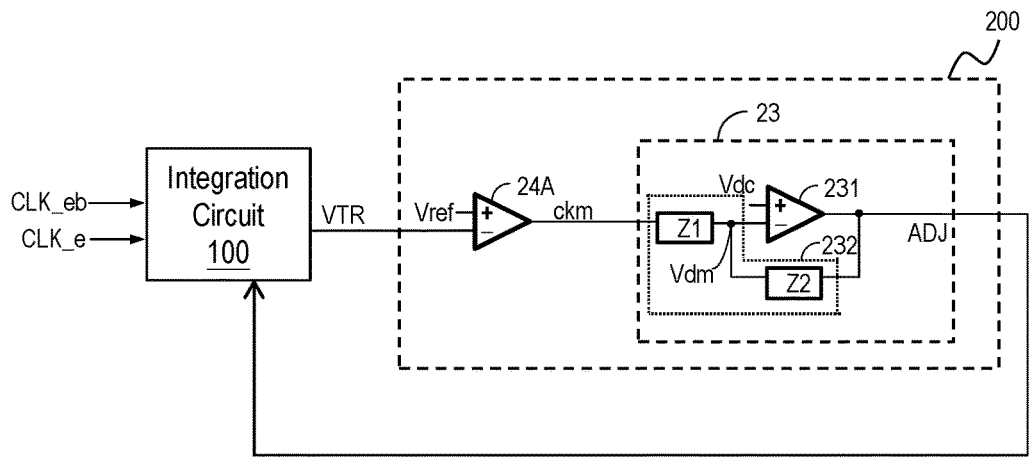
FIG. 9A shows a specific embodiment of an adjustment control circuit.
Figure 9B:
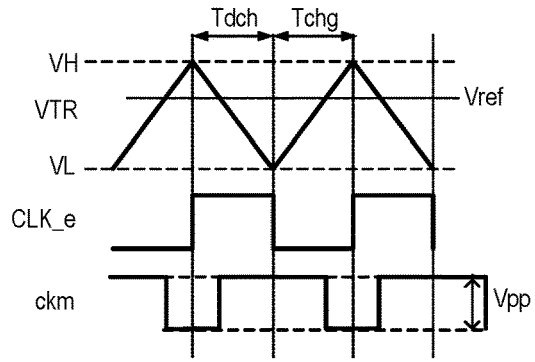
FIG. 9B illustrates a waveform diagram depicting the operation of the circuit in FIG. 9A.
Figure 9C:
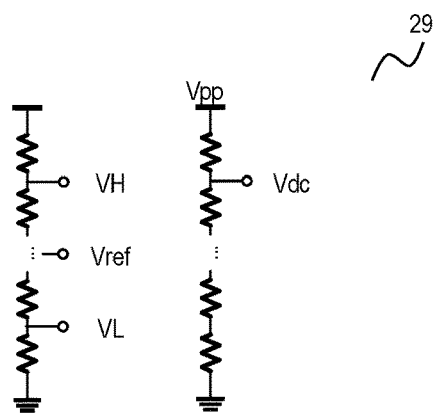
FIG. 9C shows a specific embodiment of a voltage generation circuit.

Please refer to FIG. 9A-FIG. 9C. FIG. 9A shows a specific embodiment of an adjustment control circuit. FIG. 9B illustrates a waveform diagram depicting the operation of the circuit in FIG. 9A. FIG. 9C shows a specific embodiment of a voltage generation circuit. In this embodiment, the adjustment control circuit 200 includes: a comparison circuit 24A and a filter amplification circuit 23.

The comparison circuit 24A is configured to operably compare the triangular wave signal VTR with a reference signal Vref, so as to generate a pulse width modulation (PWM) signal ckm. The filter amplification circuit 23 in FIG. 9A is similar to the filter amplification circuit 23 of the previous embodiment in FIG. 8A. The filter amplification circuit 23 of this embodiment receives the PWM signal ckm; the error amplification circuit 231 and the low-pass filter feedback network 232 are configured to operably obtain the common mode related signal, and also to operably amplify a difference between the PWM signal ckm and the predetermined DC level Vdc to generate the adjusting signal ADJ, by active low-pass filtering. In this embodiment, the common mode related signal corresponds to a voltage at a negative input terminal of the error amplification circuit 231 (which corresponds to Vdm).

In this embodiment, the predetermined DC level Vdc is correlated with the reference signal Vref, a target peak level VH of the triangular wave signal VTR, a target valley level VL of the triangular wave signal VTR, and an amplitude Vpp of the PWM signal ckm. Please refer to FIG. 9C. More specifically, in one embodiment, as shown in FIG. 9C, a voltage generation circuit 29 is configured to operably obtain the reference signal Vref, which lies between the target peak level VH and the target valley level VL, via a voltage divider circuit at the left side in FIG. 9, and another voltage divider circuit at the right side in FIG. 9 is configured to operably generate a divided-voltage of the amplitude Vpp of the PWM signal ckm according to a ratio of the reference signal Vref to a difference between the target peak level VH and the target valley level VL, thereby generating the predetermined DC level Vdc. As such, through adjusting at least one of the charging current Ichg and the discharging current Idch, when the common mode related signal Vdm of the triangular wave signal VTR is adjusted to the target DC level VCM, the triangular wave signal VTR will be a symmetrical triangular wave and an average voltage of the triangular wave signal VTR will be equal to the target DC level VCM.

Figure 10A:
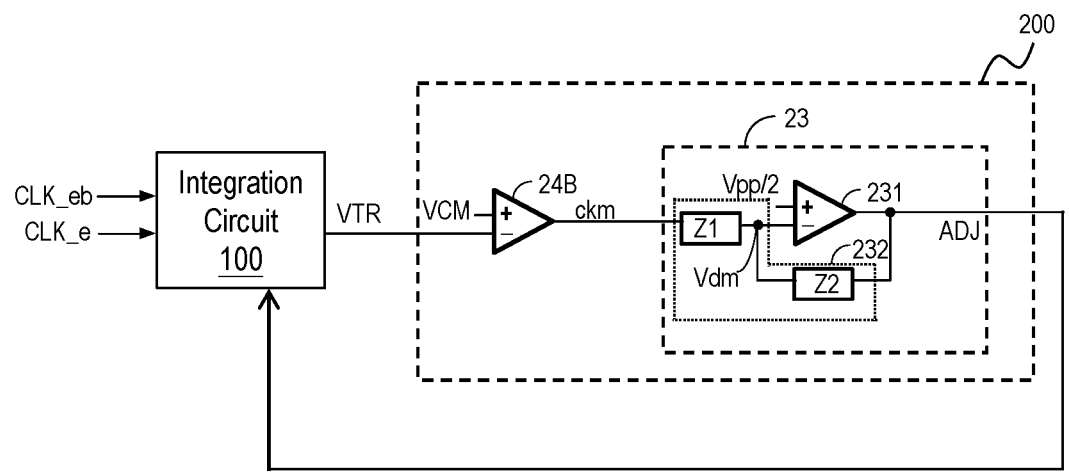
FIG. 10A shows a specific embodiment of an adjustment control circuit.
Figure 10B:
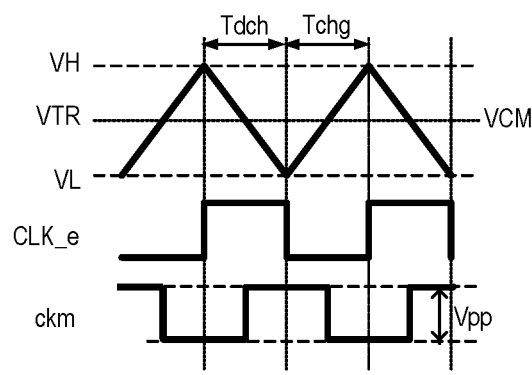
FIG. 10B illustrates a waveform diagram depicting the operation of the circuit in FIG. 10A.

Please refer to FIG. 10A and FIG. 10B. FIG. 10A shows a specific embodiment of an adjustment control circuit. FIG. 10B illustrates a waveform diagram depicting the operation of the circuit in FIG. 10A. FIG. 10A and FIG. 10B can be regarded as a specific embodiment of the above-mentioned embodiment of FIG. 9A and FIG. 9B. In this embodiment, the above-mentioned reference signal Vref (which is compared with the triangular wave signal VTR by the comparison circuit 24A in the above-mentioned embodiment of FIG. 9A) corresponds to the target DC level VCM, while, the predetermined DC level Vdc corresponds to half of the amplitude Vpp (i.e., Vpp/2) of the PWM signal ckm. In other words, in this embodiment, the comparison circuit 24B is configured to operably compare the triangular wave signal VTR with the target DC level VCM, so as to generate the PWM signal ckm, and the comparison circuit 24B is configured to operably adjust at least one of the charging current Ichg and the discharging current Idch, such that when the common mode related signal Vdm of the triangular wave signal VTR is adjusted to Vpp/2, the triangular wave signal VTR will be a symmetrical triangular wave and an average voltage of the triangular wave signal VTR will be equal to the target DC level VCM.

Figure 11A:
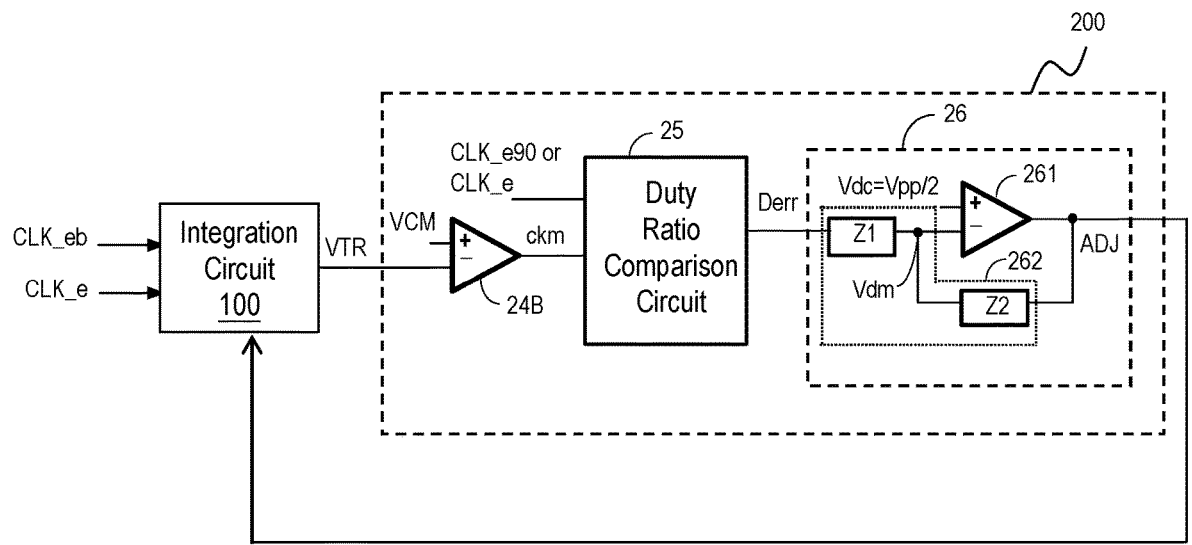
FIG. 11A shows a specific embodiment of an adjustment control circuit.
Figure 11B:
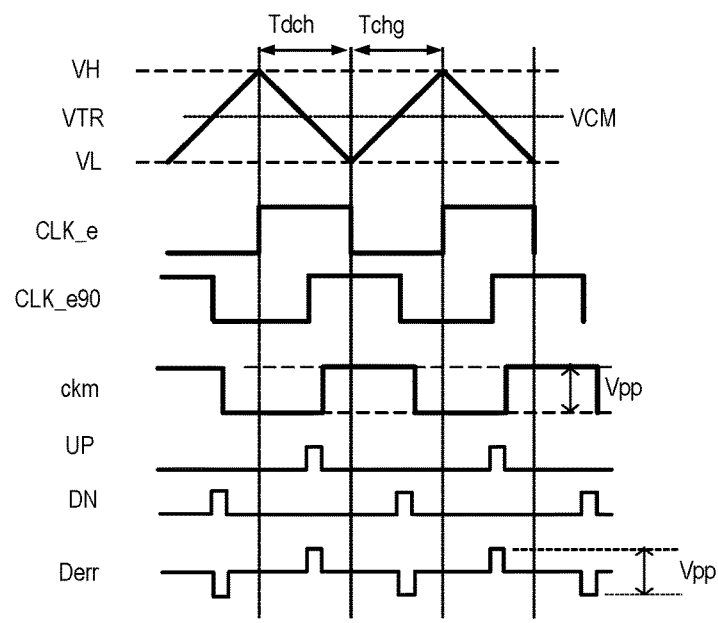
FIG. 11B illustrates a waveform diagram depicting the operation of the circuit in FIG. 11A.

Please refer to FIG. 11A and FIG. 11B. FIG. 11A shows a specific embodiment of an adjustment control circuit. FIG. 11B illustrates a waveform diagram depicting the operation of the circuit in FIG. 11A. In this embodiment, an adjustment control circuit 200 includes: a comparison circuit 24B, a duty ratio comparison circuit 25 and a filter circuit 26.

The comparison circuit 24B is configured to operably compare the triangular wave signal VTR with a target DC level VCM, so as to generate a PWM signal ckm. The duty ratio comparison circuit 25 is configured to operably compare the PWM signal ckm with the external clock signal CLK_e or to operably compare the PWM signal ckm with the phase difference clock signal CLK_e90, so as to generate a duty ratio error signal Derr. The phase of the phase difference clock signal CLK_e90 is different from the phase of the switching period Tsw by 90 degrees. The filter circuit 26 is configured to operably filter the duty ratio error signal Derr, so as to obtain the common mode related signal Vdm and also generate the adjusting signal ADJ.

In this embodiment, an error amplifier 261 and a low-pass filter feedback network 262 of the filter circuit 26 are coupled to each other to form a feedback loop; the error amplifier 261 and the low-pass filter feedback network 262 of the filter circuit 26 receive the duty ratio error signal Derr to operably obtain the common mode related signal Vdm, and the error amplifier 261 and the low-pass filter feedback network 262 also operably amplify a difference between the duty ratio error signal Derr and the predetermined DC level Vdc to generate the adjusting signal ADJ, by active low-pass filtering. As such, in this embodiment, through adjusting at least one of the charging current Ichg and the discharging current Idch, when the common mode related signal Vdm of the duty ratio error signal Derr (which is the common mode related signal of the triangular wave signal VTR in this embodiment) is adjusted to Vpp/2, the triangular wave signal VTR will be a symmetrical triangular wave and an average voltage of the triangular wave signal VTR will be equal to the target DC level VCM.

Figure 12A:
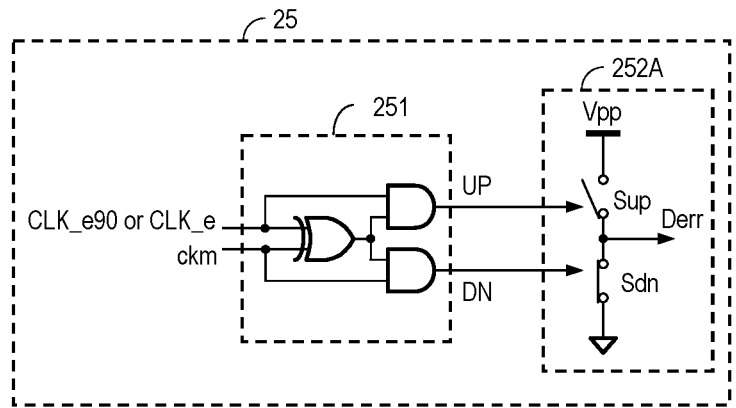
FIG. 12A shows a specific embodiment of a duty ratio comparison circuit.

Please refer to FIG. 12A in conjugation with FIG. 11A. FIG. 12A shows a specific embodiment of a duty ratio comparison circuit. In one embodiment, the duty ratio comparison circuit 25 includes: a logic comparison circuit 251 and a switching circuit 252A. The logic comparison circuit 251 is configured to operably compare the PWM signal ckm with the external clock signal CLK_e or is configured to operably compare the PWM signal ckm with the phase difference clock signal CLK_e90, so as to generate a pull-up signal UP and a pull-down signal DN, which are indicative of a duty ratio difference of a rising edge and a duty ratio difference of a falling edge, respectively. In this embodiment, as shown in FIG. 12A, the switching circuit 252A includes: an upper side switch Sup and a lower side switch Sdn, which are connected in series between a supply voltage Vpp and a ground level. The upper side switch Sup and the lower side switch Sdn are switched according to the pull-up signal UP and the pull-down signal DN, respectively, to generate the duty ratio error signal Derr. A voltage difference between the supply voltage Vpp and the ground level corresponds to an amplitude (i.e., Vpp) of the duty ratio error signal Derr. The filter circuit 26 is configured to operably filter the duty ratio error signal Derr, so as to obtain the common mode related signal and also generate the adjusting signal ADJ.

Figure 12B:
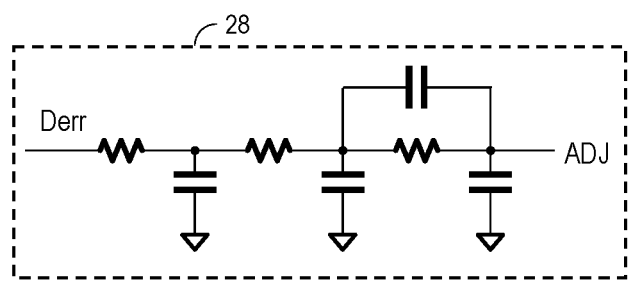
FIG. 12B shows a specific embodiment of a filter circuit.

Please refer to FIG. 12B, which shows a specific embodiment of a filter circuit. In the embodiment wherein the adjustment control circuit 200 includes a switching circuit 252A (as shown in FIG. 12A), the filter circuit 26 in the previous embodiment shown in FIG. 11A can be replaced by a passive type filter circuit 28 shown in FIG. 12B, wherein the filter circuit 28 shown in FIG. 12B is configured to operably filter the duty ratio error signal Derr, so as to obtain the common mode related signal and also generate the adjusting signal ADJ.

Figure 13:
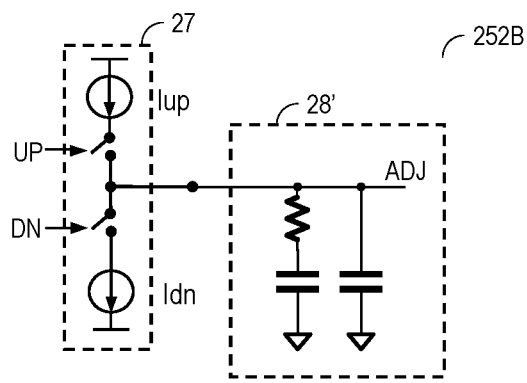
FIG. 13 shows a specific embodiment of a switching circuit and a specific embodiment of a filter circuit.

Please refer to FIG. 13, which shows a specific embodiment of a switching circuit and a specific embodiment of a filter circuit. In this embodiment, the switching circuit 252B includes: an upper side current source Iup and a lower side current source Idn, which are connected in series between the supply voltage Vpp and the ground level. The upper side current source Iup and the lower side current source Idn are controlled the pull-up signal UP and the pull-down signal DN, respectively, so as to generate the duty ratio error signal Derr. A voltage difference between the supply voltage Vpp and the ground level corresponds to an amplitude of the duty ratio error signal Derr. The filter circuit 28' is configured to operably perform integration on the duty ratio error signal Derr and filter the duty ratio error signal Derr, so as to obtain the common mode related signal and also generate the adjusting signal ADJ.

Figure 14A:
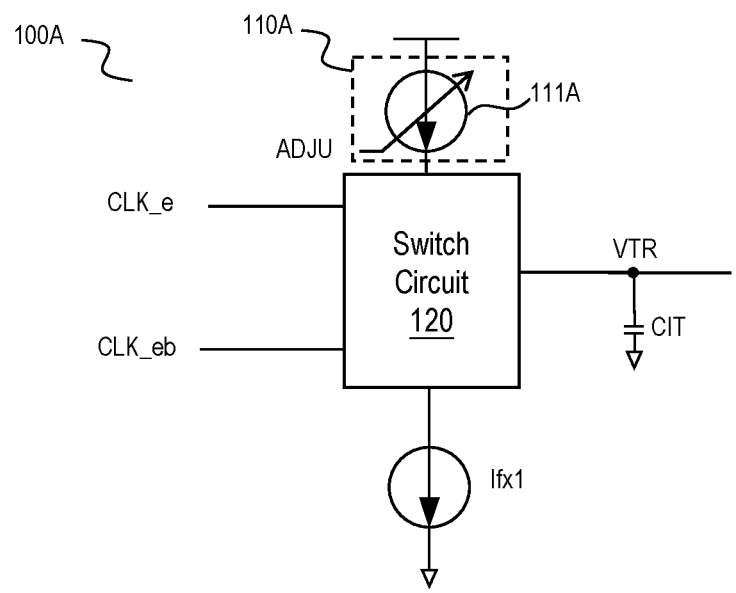
FIGS. 14A-14B show specific embodiments of an integration circuit.
Figure 14B:
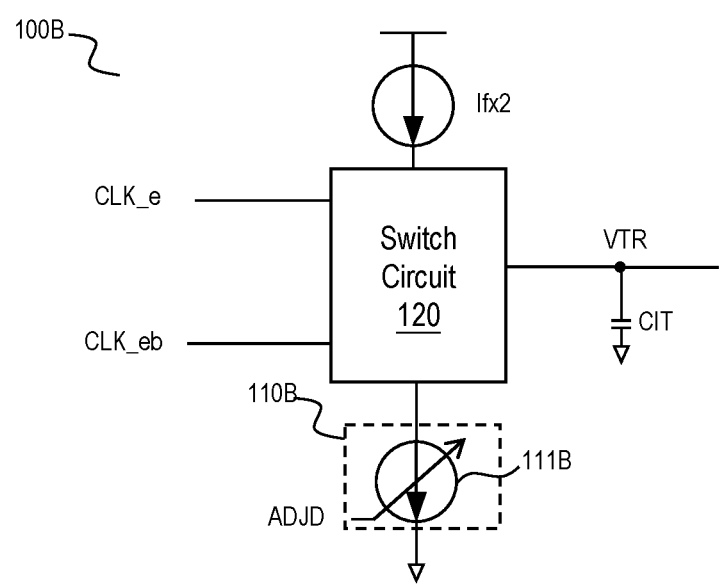

Please refer to FIGS. 14A-14B, which show specific embodiments of an integration circuit. In one embodiment, as shown in FIG. 14A, an integration circuit 100A includes: an integration capacitor CIT, a variable current circuit 110A, a constant current source Ifx1 and a selection circuit 120. The variable current circuit 110A is configured to operably generate the charging current Ichg according to the adjusting signal ADJ. The constant current source Ifx1 is configured to operably generate the discharging current Idch. The selection circuit 120 is configured to operably select the charging current Ichg or the discharging current Idch to perform integration on the integration capacitor CIT according to an external clock signal CLK_e, so as to generate the triangular wave signal VTR.

In one embodiment, as shown in FIG. 14B, an integration circuit 100B includes: an integration capacitor CIT, a variable current circuit 110B, a constant current source Ifx2 and a selection circuit 120. The variable current circuit 110B is configured to operably generate the discharging current Idch according to the adjusting signal ADJ. The constant current source Ifx2 is configured to operably generate the charging current Ichg. The selection circuit 120 is configured to operably select the charging current Ichg or the discharging current Idch to perform integration on the integration capacitor CIT according to an external clock signal CLK_e, so as to generate the triangular wave signal VTR.

Please refer to FIGS. 15A-15D, which show specific embodiments of a variable current circuit.

Figure 15A:
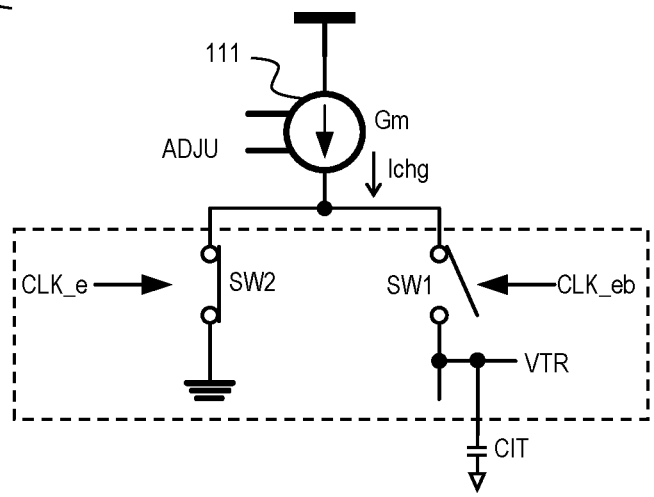
FIGS. 15A-15D show specific embodiments of a variable current circuit.

In one embodiment, as shown in FIG. 15A, a variable current circuit 115A includes a voltage-controlled current source 111, which is configured to operably generate the charging current Ichg according to the adjusting signal ADJ (i.e., the adjusting signal ADJU in this embodiment) and a transconductance coefficient Gm. In another embodiment, the voltage-controlled current source 111 can be configured to generate the discharging current Idch according to the adjusting signal ADJU and the transconductance coefficient Gm.

Figure 15B:
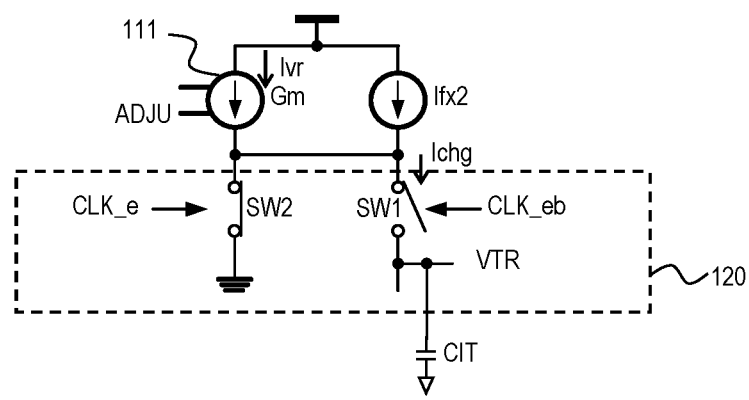
Figure 15C:
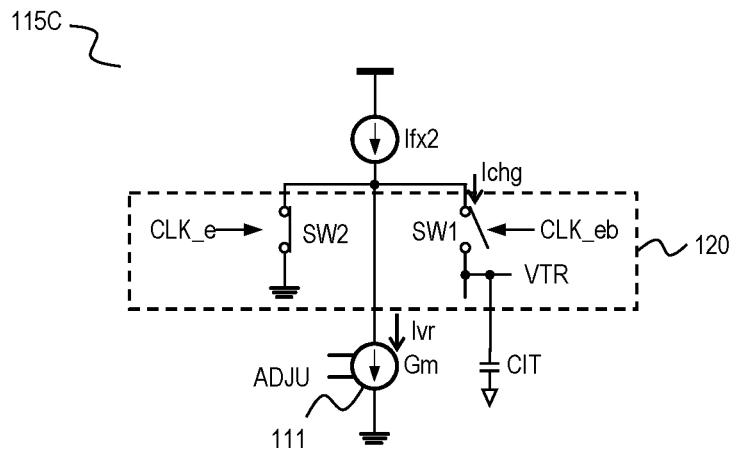

In one embodiment, as shown in FIG. 15B and FIG. 15C, a variable current circuit (i.e., variable current circuit 115B in FIG. 15B or variable current circuit 115C in FIG. 15C) includes: a voltage-controlled current source 111 and a constant current source Ifx2. The voltage-controlled current source 111 and the constant current source Ifx2 are configured to operably generate a variable current Ivr according to the adjusting signal ADJ (i.e., the adjusting signal ADJU in this embodiment) and a transconductance coefficient Gm. A sum between the variable current Ivr and a current of the constant current source Ifx2 (as shown in FIG. 15B) or a difference between the variable current Ivr and a current of the constant current source Ifx2 (as shown in FIG. 15C) corresponds to the charging current Ichg. In another embodiment, the sum between the variable current Ivr and a current of the constant current source Ifx2 (as shown in FIG. 15B) or the difference between the variable current Ivr and a current of the constant current source Ifx2 (as shown in FIG. 15C) can be configured to generate the discharging current Idch according to the adjusting signal ADJD and a transconductance coefficient Gm.

Figure 15D:
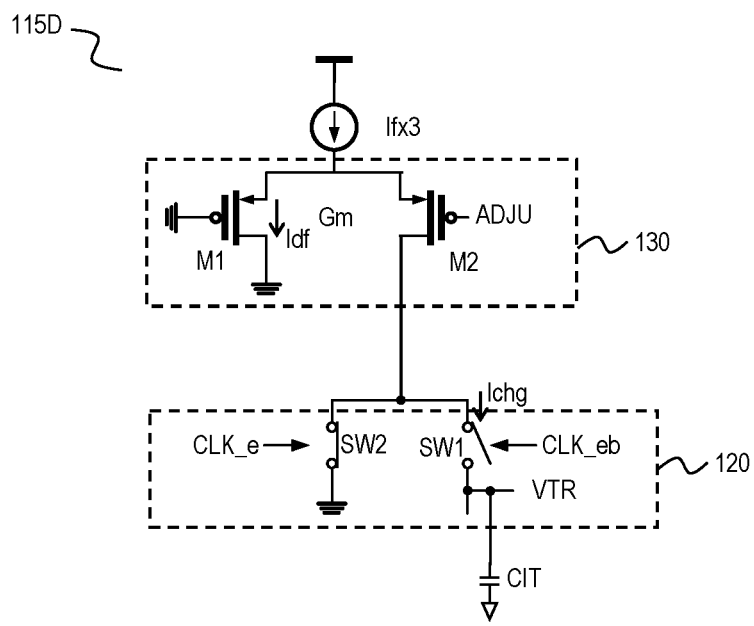

In one embodiment, as shown in FIG. 15D, a variable current circuit 115D includes: a constant current source Ifx3 and a differential transistor pair 130. A transistor M1 and a transistor M2 in the differential transistor pair 130 are configured to commonly receive and distribute the current of the constant current source Ifx3. The transistor M1 in the differential transistor pair 130 is offset to a reference voltage (e.g., aground level), whereas, the transistor M2 in the differential transistor pair 130 is controlled by the adjusting signal ADJ (i.e., as shown by the adjusting signal ADJU in FIG. 15D). A current flowing through the transistor M2 in the differential transistor pair 130 corresponds to the charging current Ichg. More specifically, in this embodiment, the charging current Ichg is equal to a difference of the constant current source Ifx3 minus a branch current Idf, which can be represented by a following equation:

charging current Ichg=constant current source Ifx3– branch current Idf.

In another embodiment, a current flowing through either one of the transistor M1 and the transistor M2 in the differential transistor pair 130 can be configured to generate the discharging current Idch according to the adjusting signal ADJD (not shown in in FIG. 15D) and a transconductance coefficient Gm.

Please still refer to FIGS. 15A-15D. In one embodiment, a selection circuit 120 includes: a major switch SW1 and a bypass switch SW2. The major switch SW1 is configured to operably control one of the charging current Ichg and the discharging current Idch to perform integration on the integration capacitor CIT. The bypass switch SW2 is configured to operably cause one of the charging current Ichg and the discharging current Idch to be conducted to a reference level in a case where one of the charging current Ichg and the discharging current Idch does not perform integration on the integration capacitor CIT, thereby reducing unwanted interference during switching operation.

Figure 16:
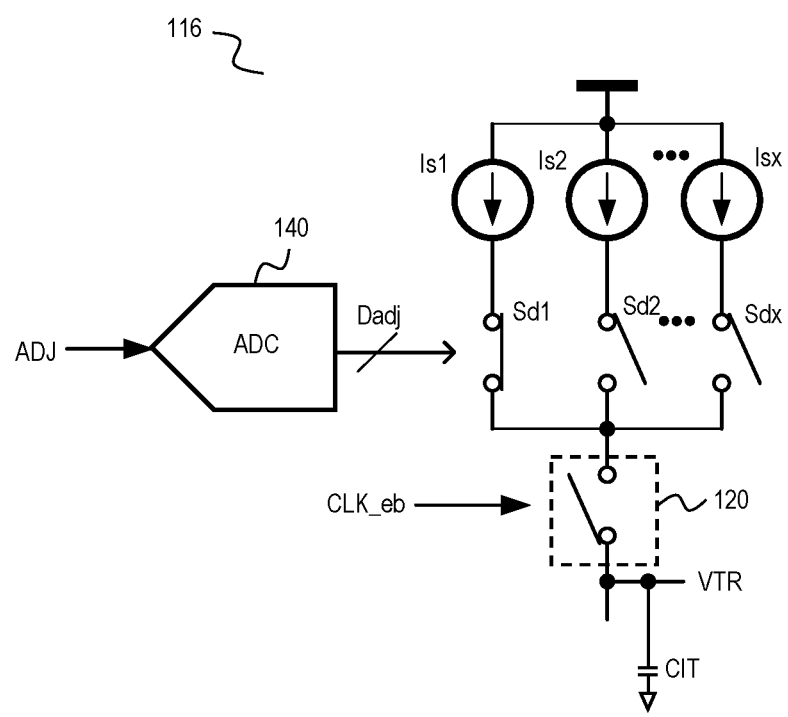
FIG. 16 shows a specific embodiment of a variable current circuit.

Please refer to FIG. 16, which shows a specific embodiment of a variable current circuit. In one embodiment, as shown in FIG. 16, a variable current circuit 116 includes: an analog-to-digital converter (ADC) 140, at least one sub-current source (as shown by sub-current sources Is1~Isx in FIG. 16, wherein x denotes a positive integer) and at least one conversion switch (as shown by conversion switches Sd1~Sdx in FIG. 16, wherein x denotes a positive integer). The ADC 140 is configured to operably convert the adjusting signal ADJ to a digital switching signal Dadj. At least one conversion switch (Sd1~Sdx) is coupled to the corresponding at least one sub-current source (Is1~Isx). The at least one conversion switch (Sd1~Sdx) receives the digital switching signal Dadj and operates accordingly, so as to correspondingly control and combine the at least one sub-current source (Is1~Isx), thus generating one of the charging current Ichg and the discharging current Idch in accordance to the adjusting signal ADJ.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A low distortion triangular wave generator circuit, comprising:
    an integration circuit, which is configured to operably receive an external clock signal, wherein during a charging period and a discharging period within a switching period of the external clock signal, the integration circuit respectively performs integration on an integration capacitor by a charging current and a discharging current, so as to generate a triangular wave signal; wherein a time length of the charging period is identical to a time length of the discharging period; and
    an adjustment control circuit, which is configured to operably generate a common mode related signal according to the triangular wave signal, wherein the common mode related signal is related to a common mode characteristic of the triangular wave signal, and wherein the adjustment control circuit is configured to operably generate an adjusting signal with a gain according to a difference between the common mode related signal and a predetermined direct current (DC) level;

wherein the adjusting signal is configured to operably adjust at least one of the charging current and the discharging current by feedback mechanism, such that the triangular wave signal is a symmetrical triangular wave and an average voltage of the triangular wave signal is equal to a target DC level.

2. The low distortion triangular wave generator circuit of claim 1, wherein the adjustment control circuit only adjusts one of the charging current and the discharging current.

3. The low distortion triangular wave generator circuit of claim 1, wherein the adjustment control circuit includes:
   a sample-and-hold circuit, which is configured to operably and periodically sample and hold the triangular wave signal at a sample-and-hold timing point within the switching period, so as to generate the common mode related signal; and
   an error amplification circuit, which is configured to operably amplify the difference between the common mode related signal and the predetermined DC level, so as to generate the adjusting signal, wherein a relationship between the predetermined DC level and the target DC level is determined according to a ratio relationship between the sample-and-hold timing point and the switching period.

4. The low distortion triangular wave generator circuit of claim 3, wherein the sample-and-hold circuit is configured to operably sample and hold the triangular wave signal according to a phase difference clock signal, wherein a phase of the phase difference clock signal is different from a phase of the switching period by 90 degrees, such that a middle value of a rising ramp or a middle value of a falling ramp of the triangular wave signal is sampled and held, thus generating the common mode related signal;
   wherein the error amplification circuit adopts the target DC level as the predetermined DC level.

5. The low distortion triangular wave generator circuit of claim 4, wherein the sample-and-hold circuit is configured to operably sample and hold the triangular wave signal in an interleaving manner, and the sampled and held results is combined to become the common mode related signal.

6. The low distortion triangular wave generator circuit of claim 3, wherein the low distortion triangular wave generator circuit is characterized in one of the following:
   (1) wherein the sample-and-hold circuit is configured to operably sample and hold a peak of the triangular wave signal according to the external clock signal, so as to generate the common mode related signal; wherein the error amplification circuit adopts a target peak level of the triangular wave signal as the predetermined DC level; or
   (2) wherein the sample-and-hold circuit is configured to operably sample and hold a valley of the triangular wave signal according to the external clock signal, so as to generate the common mode related signal; wherein the error amplification circuit adopts a target valley level of the triangular wave signal as the predetermined DC level.

7. The low distortion triangular wave generator circuit of claim 1, wherein the adjustment control circuit includes a filter amplification circuit, which includes:
   an error amplifier; and
   a low-pass filter feedback network, which is coupled to the error amplifier to form a feedback loop, wherein the low-pass filter feedback network is configured to operably receive the triangular wave signal to obtain the common mode related signal and also to amplify a difference between the triangular wave signal and the predetermined DC level to generate the adjusting signal; wherein the error amplifier adopts the target DC level as the predetermined DC level.

8. The low distortion triangular wave generator circuit of claim 1, wherein the adjustment control circuit includes:
   a comparison circuit, which is configured to operably compare the triangular wave signal with a reference signal, so as to generate a pulse width modulation (PWM) signal; and
   a filter amplification circuit, including:
      an error amplification circuit; and
      a low-pass filter feedback network, which is coupled to the error amplification circuit to form a feedback loop, wherein the low-pass filter feedback network is configured to operably receive the PWM signal to obtain the common mode related signal and also to amplify a difference between the PWM signal and the predetermined DC level to generate the adjusting signal; wherein the predetermined DC level is correlated with the reference signal, a target peak level of the triangular wave signal, a target valley level of the triangular wave signal and an amplitude of the PWM signal; and wherein the reference signal lies between the target peak level and the target valley level.

9. The low distortion triangular wave generator circuit of claim 8, wherein the reference signal corresponds to the target DC level, whereas, the predetermined DC level corresponds to ½ of the amplitude of the PWM signal.

10. The low distortion triangular wave generator circuit of claim 1, wherein the adjustment control circuit includes:
   a comparison circuit, which is configured to operably compare the triangular wave signal with the target DC level, so as to generate a pulse width modulation (PWM) signal;
   a duty ratio comparison circuit, which is configured to operably compare the PWM signal with the external clock signal or which is configured to operably compare the PWM signal with a phase difference clock signal, so as to generate a duty ratio error signal, wherein a phase of the phase difference clock signal is different from a phase of the switching period by 90 degrees; and
   a filter circuit, which is configured to operably filter the duty ratio error signal, so as to obtain the common mode related signal and also generate the adjusting signal.

11. The low distortion triangular wave generator circuit of claim 10, wherein the filter circuit includes:
   an error amplification circuit; and
   a low-pass filter feedback network, which is coupled to the error amplification circuit to form a feedback loop, wherein the error amplification circuit and the low-pass filter feedback network are configured to operably receive the duty ratio error signal to obtain the common mode related signal and also to amplify a difference between the duty ratio error signal and the predetermined DC level to generate the adjusting signal; wherein the predetermined DC level corresponds to ½ of an amplitude of the duty ratio error signal.

12. The low distortion triangular wave generator circuit of claim 10, wherein the duty ratio comparison circuit includes:
   a logic comparison circuit, which is configured to operably compare the PWM signal with the external clock signal or which is configured to operably compare the PWM signal with the phase difference clock signal, so as to generate a pull-up signal and a pull-down signal, indicating a duty ratio difference of a rising edge and a duty ratio difference of a falling edge, respectively; and a switching circuit, which is configured as one of the following:
(1) the switching circuit includes: an upper side switch and a lower side switch, which are connected in series between a supply voltage and a ground level, wherein the upper side switch and the lower side switch are switched according to the pull-up signal and the pull-down signal, respectively, so as to generate the duty ratio error signal, wherein a voltage difference between the supply voltage and the ground level corresponds to an amplitude of the duty ratio error signal, wherein the filter circuit is configured to operably filter the duty ratio error signal, so as to obtain the common mode related signal and also generate the adjusting signal; or
(2) the switching circuit includes: an upper side current source and a lower side current source, which are connected in series between the supply voltage and the ground level, wherein the upper side current source and the lower side current source are switched according to the pull-up signal and the pull-down signal, respectively, so as to generate the duty ratio error signal, wherein a voltage difference between the supply voltage and the ground level corresponds to an amplitude of the duty ratio error signal, wherein the filter circuit is configured to operably perform integration on and filter the duty ratio error signal, so as to obtain the common mode related signal and also generate the adjusting signal.

13. The low distortion triangular wave generator circuit of claim 1, wherein the integration circuit includes:
the integration capacitor;
a variable current circuit, which is configured to operably generate one of the charging current and the discharging current according to the adjusting signal;
a first constant current source, which is configured to operably generate the other of the charging current and the discharging current; and
a selection circuit, which is configured to operably select the charging current or the discharging current to perform integration on the integration capacitor according to the external clock signal, so as to generate the triangular wave signal.

14. The low distortion triangular wave generator circuit of claim 13, wherein the variable current circuit is configured as one of the following:
(1) the variable current circuit includes:
a voltage-controlled current source, which is configured to operably generate one of the charging current and the discharging current according to the adjusting signal and a transconductance coefficient;
(2) the variable current circuit includes:
a voltage-controlled current source, which is configured to operably generate a variable current according to the adjusting signal and the transconductance coefficient; and
a second constant current source, wherein a sum or a difference between the variable current and a current of the second constant current source corresponds to one of the charging current and the discharging current;
(3) the variable current circuit includes:
a third constant current source;
a differential transistor pair, which commonly receive and distribute a current of the third constant current source, wherein one of the differential transistor pair is offset to a reference voltage, whereas, the other of the differential transistor pair is controlled by the adjusting signal, wherein a current flowing through the differential transistor pair corresponds to one of the charging current and the discharging current; or
(4) the variable current circuit includes:
an analog-to-digital converter (ADC), which is configured to operably convert the adjusting signal to a digital switching signal;
at least one sub-current source;
at least one conversion switch, which is coupled to the corresponding at least one sub-current source, wherein the at least one conversion switch is configured to operably receive the digital switching signal, so as to correspondingly switch the at least one sub-current source, and combine the current of the at least one sub-current source to generate one of the charging current and the discharging current in accordance to the adjusting signal.

15. The low distortion triangular wave generator circuit of claim 14, wherein in a case where the variable current circuit is configured as (1), (2) or (3), the selection circuit includes:
a major switch, which is configured to operably control one of the charging current and the discharging current to perform integration on the integration capacitor; and
a bypass switch, which is configured to operably cause one of the charging current and the discharging current to be conducted to a reference level in a case where one of the charging current and the discharging current does not perform integration on the integration capacitor.

16. A low distortion triangular wave generation method, comprising:
during a charging period and a discharging period within a switching period of an external clock signal, respectively performing integration on an integration capacitor by a charging current and a discharging current, so as to generate a triangular wave signal; wherein a time length of the charging period is identical to a time length of the discharging period; and
generating a common mode related signal according to the triangular wave signal, wherein the common mode related signal is related to a common mode characteristic of the triangular wave signal, and generating an adjusting signal with a gain according to a difference between the common mode related signal and a predetermined direct current (DC) level; and
adjusting at least one of the charging current and the discharging current according to the adjusting signal by feedback mechanism, such that the triangular wave signal is a symmetrical triangular wave and an average voltage of the triangular wave signal is equal to a target DC level.

17. The low distortion triangular wave generation method of claim 16, wherein only one of the charging current and the discharging current is adjusted.

18. The low distortion triangular wave generation method of claim 16, wherein the step of generating the adjusting signal includes:
periodically sampling and holding the triangular wave signal at a sample-and-hold timing point within the switching period, so as to generate the common mode related signal; and
amplifying the difference between the common mode related signal and the predetermined DC level, so as to generate the adjusting signal, wherein a relationship between the predetermined DC level and the target DC level is determined according to a ratio relationship between the sample-and-hold timing point and the switching period.

19. The low distortion triangular wave generation method of claim 18, wherein the step of generating the common mode related signal includes:
sampling and holding the triangular wave signal according to a phase difference clock signal, wherein a phase of the phase difference clock signal is different from a phase of the switching period by 90 degrees, such that a middle value of a rising ramp or a middle value of a falling ramp of the triangular wave signal is sampled and held, thus generating the common mode related signal;
wherein the target DC level is adopted as the predetermined DC level.

20. The low distortion triangular wave generation method of claim 19, wherein the step of generating the common mode related signal further including:
sampling and holding the triangular wave signal in an interleaving manner, and combining the sampled and held results to become the common mode related signal.

21. The low distortion triangular wave generation method of claim 18, wherein the step of periodically sampling and holding the triangular wave signal to generate the common mode related signal includes one of the following:
(1) sampling and holding a peak of the triangular wave signal according to the external clock signal, so as to generate the common mode related signal; wherein a target peak level of the triangular wave signal is adopted as the predetermined DC level; or
(2) sampling and holding a valley of the triangular wave signal according to the external clock signal, so as to generate the common mode related signal; wherein a target valley level of the triangular wave signal is adopted as the predetermined DC level.

22. The low distortion triangular wave generation method of claim 16, wherein the step of generating the adjusting signal includes:
obtaining the common mode related signal by low-pass filtering and amplifying a difference between the triangular wave signal and the predetermined DC level to generate the adjusting signal;
wherein the target DC level is adopted as the predetermined DC level.

23. The low distortion triangular wave generation method of claim 16, wherein the step of generating the adjusting signal includes:
comparing the triangular wave signal with a reference signal, so as to generate a pulse width modulation (PWM) signal; and
obtaining the common mode related signal and also amplifying a difference between the PWM signal and the predetermined DC level to generate the adjusting signal by active low-pass filtering; wherein the predetermined DC level is correlated with the reference signal, a target peak level of the triangular wave signal, a target valley level of the triangular wave signal and an amplitude of the PWM signal; and wherein the reference signal lies between the target peak level and the target valley level.

24. The low distortion triangular wave generation method of claim 23, wherein the reference signal corresponds to the target DC level, and the predetermined DC level corresponds to ½ of the amplitude of the PWM signal.

25. The low distortion triangular wave generation method of claim 16, wherein the step of generating the adjusting signal includes:
comparing the triangular wave signal with the target DC level, so as to generate a pulse width modulation (PWM) signal;
comparing the PWM signal with the external clock signal or comparing the PWM signal with a phase difference clock signal, so as to generate a duty ratio error signal, wherein a phase of the phase difference clock signal is different from a phase of the switching period by 90 degrees; and
filtering the duty ratio error signal, so as to obtain the common mode related signal and also generate the adjusting signal.

26. The low distortion triangular wave generation method of claim 25, wherein the step of filtering the duty ratio error signal includes:
obtaining the common mode related signal and amplifying a difference between the duty ratio error signal and the predetermined DC level to generate the adjusting signal by active low-pass filtering; wherein the predetermined DC level corresponds to ½ of an amplitude of the duty ratio error signal.

* * * * *